(12) United States Patent
Bol et al.

(10) Patent No.: US 10,100,402 B2
(45) Date of Patent: Oct. 16, 2018

(54) SUBSTRATE HOLDER FOR GRAPHENE FILM SYNTHESIS

(75) Inventors: Ageeth A. Bol, Yorktown Heights, NY (US); Xuesong Li, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 1353 days.

(21) Appl. No.: 13/269,037

(22) Filed: Oct. 7, 2011

(65) Prior Publication Data

US 2013/0089666 A1 Apr. 11, 2013

(51) Int. Cl.
*C23C 16/26* (2006.01)
*C01B 32/186* (2017.01)
*C23C 16/458* (2006.01)
*B82Y 30/00* (2011.01)
*B82Y 40/00* (2011.01)

(52) U.S. Cl.
CPC .............. *C23C 16/26* (2013.01); *B82Y 30/00* (2013.01); *B82Y 40/00* (2013.01); *C01B 32/186* (2017.08); *C23C 16/4582* (2013.01)

(58) Field of Classification Search
CPC ..... C01B 31/0453; B82Y 40/00; B82Y 30/00; C23C 16/4582; C23C 16/26; H01L 21/6735–21/67396
USPC ........................................................ 118/715
See application file for complete search history.

(56) References Cited

U.S. PATENT DOCUMENTS

| | | | | |
|---|---|---|---|---|
| 5,614,447 A | * | 3/1997 | Yamaga | C30B 29/06 148/DIG. 113 |
| 6,119,865 A | * | 9/2000 | Kawada | H01L 21/67369 206/303 |
| 6,174,377 B1 | * | 1/2001 | Doering | C23C 16/44 118/715 |
| 6,202,591 B1 | * | 3/2001 | Witzman | C23C 14/243 118/723 VE |
| 6,262,393 B1 | * | 7/2001 | Imai | C23C 16/458 118/50.1 |
| 6,787,485 B1 | * | 9/2004 | Probst | C21D 9/00 136/201 |
| 6,857,523 B1 | * | 2/2005 | Yamashita | B65D 25/14 206/204 |

(Continued)

OTHER PUBLICATIONS

Kim, K. et al., Grain Boundary Mapping in Polycrystalline Graphene, ACS Nano ASAP (2011).

(Continued)

*Primary Examiner* — Gordon R Baldwin
*Assistant Examiner* — Mirza Javed
(74) *Attorney, Agent, or Firm* — Ryan, Mason & Lewis, LLP

(57) ABSTRACT

An apparatus and method for graphene film synthesis. The apparatus includes a quasi enclosed substrate holder which includes one open side, a cap disposed over the one open side of the quasi enclosed substrate holder, and a substrate for graphene film synthesis located inside the quasi enclosed substrate holder. The method includes placing a substrate for graphene film synthesis inside of a quasi enclosed substrate holder and generating a graphene film on the substrate via chemical vapor deposition, wherein the quasi enclosed substrate holder includes one open side and a cap disposed over the open side of the quasi enclosed substrate holder.

8 Claims, 3 Drawing Sheets

(56) References Cited

U.S. PATENT DOCUMENTS

| | | | |
|---|---|---|---|
| 6,921,556 B2 * | 7/2005 | Shimizu | C23C 16/4409 427/248.1 |
| 7,723,687 B2 | 5/2010 | Nagarkar et al. | |
| 2002/0045329 A1 | 4/2002 | Oi et al. | |
| 2002/0124906 A1 * | 9/2002 | Suzuki | H01L 21/67017 141/98 |
| 2003/0050195 A1 | 3/2003 | Wiesmann et al. | |
| 2004/0071874 A1 * | 4/2004 | Shimizu | C23C 16/4409 427/248.1 |
| 2004/0265212 A1 | 12/2004 | Varadan et al. | |
| 2006/0065571 A1 * | 3/2006 | Hsiao | H01L 21/67126 206/710 |
| 2006/0108250 A1 * | 5/2006 | Johnson | G03F 1/66 206/455 |
| 2006/0237343 A1 * | 10/2006 | Fuyumuro | H01L 21/67132 206/710 |
| 2007/0094928 A1 * | 5/2007 | Hunter | A01G 27/04 47/79 |
| 2007/0169700 A1 | 7/2007 | Sniders et al. | |
| 2010/0203199 A1 * | 8/2010 | Ferro | B65D 21/086 426/111 |
| 2010/0247803 A1 | 9/2010 | Lee et al. | |
| 2011/0017127 A1 * | 1/2011 | von Kanel | C23C 16/4408 117/97 |
| 2011/0081747 A1 * | 4/2011 | Yoshitomi | H01L 27/1225 438/104 |
| 2011/0091647 A1 * | 4/2011 | Colombo | B82Y 30/00 427/249.1 |
| 2013/0052119 A1 * | 2/2013 | Kim | C23C 16/26 423/445 B |

OTHER PUBLICATIONS

Yazyev, O.V. et al., Electronic Transport in Polycrystalline Graphene, Nature Materials 9, 806 (2010).

Li X, et al., Large Area Graphene Single Crystals Grown by Low Pressure Chemical Vapor Deposition of Methane on Copper, JACS, in press (2011).

Yu et al., Control and Characterization of Individual Grains and Grain Boundaries in Graphene Grown by Chemical Vapour Deposition, Nature Materials 10, 443 (2011).

Li X, et al., Graphene Films with Large Domain Size by a Two-Step Chemical Vapor Deposition Process, Nano Letters 10, 4328 (2010).

* cited by examiner

SUBSTRATE HOLDER FOR GRAPHENE FILM SYNTHESIS

STATEMENT OF GOVERNMENT RIGHTS

This invention was made with Government support under Contract No.: FA8650-08-C-7838 awarded by Defense Advanced Research Projects Agency (DARPA). The Government has certain rights in this invention.

FIELD OF THE INVENTION

Embodiments of the invention generally relate to electronic devices and, more particularly, to graphene film synthesis.

BACKGROUND OF THE INVENTION

Synthesis of graphene films on copper (Cu) foils by chemical vapor deposition (CVD) of hydrocarbons show promise for graphene production. However, existing approaches produce chemical vapor deposition graphene films that are polycrystalline with grain size typically less than 10 micrometers. Such existing approaches attempt to optimize synthesis parameters such as, for example, temperature and hydrocarbon partial pressure.

Larger graphene grain size can be achieved at higher temperature and lower hydrocarbon partial pressure. However, disadvantages exist in that there are limitations on these parameters. For example, temperature is limited by the copper (Cu) melting point, and the hydrocarbon partial pressure cannot be too low to get effective growth. Accordingly, the grain size of graphene is limited even with these noted optimized parameters.

In this particular application, there is a need for large-grain graphene film synthesis techniques.

SUMMARY OF THE INVENTION

In one aspect of the invention, an apparatus for graphene film synthesis is provided. The apparatus includes a quasi enclosed substrate holder which includes one open side, a cap disposed over the one open side of the quasi enclosed substrate holder, and a substrate for graphene film synthesis located inside the quasi enclosed substrate holder.

Another aspect of the invention includes a method for generating a graphene film is provided. The method includes the steps of placing a substrate for graphene film synthesis inside of a quasi enclosed substrate holder and generating a graphene film on to the substrate via chemical vapor deposition, wherein the quasi enclosed substrate holder includes one open side and a cap disposed over the open side of the quasi enclosed substrate holder.

These and other objects, features and advantages of the present invention will become apparent from the following detailed description of illustrative embodiments thereof, which is to be read in connection with the accompanying drawings.

DETAILED DESCRIPTION OF EMBODIMENTS

Figure 1:
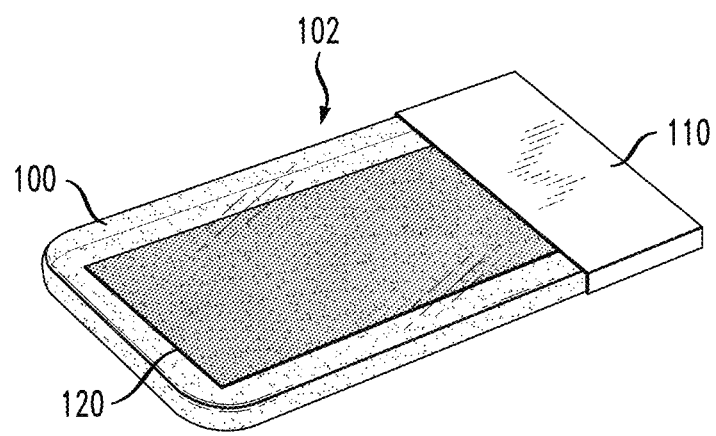
FIG. 1 is a diagram illustrating an overhead view of an example design, according to an embodiment of the present invention.

An aspect of the invention includes a quasi-enclosed substrate holder for large-grain graphene film synthesis by chemical vapor deposition (CVD). As used herein, large-grain graphene film can include graphene film of more than hundreds of micrometers in length. Other chemical vapor deposition grown graphene, such as those in existing approaches, generally has grain size in the order of several to tens of micrometers.

As noted herein, chemical vapor deposition grown graphene films are polycrystalline, and grain boundaries as well as intrinsic topological defects of polycrystalline materials can markedly alter the electronic transport in graphene. By way merely of example, description of grain boundaries and topological defects affecting electronic transport can be found in Yu et al., Control and characterization of individual grains and grain boundaries in graphene grown by chemical vapour deposition, Nature Materials 10, 443 (2011), and Li et al., Letter Graphene Films with Large Domain Size by a Two-Step Chemical Vapor Deposition Process, Nano Lett. 10, 4328 (2010). Also, graphene grain size is affected by temperature, hydrocarbon flow rate and partial pressure.

By way merely of example, graphene grains grown on the inside of a copper enclosure are found to be much larger than those grown on the outside of such an enclosure. The copper foil enclosure is customarily formed, in such existing approaches, by bending the copper foil, followed by crimping the three remaining sides. Such an approach, however, is not scalable because with the increase of grain size, the foil enclosure may collapse, thereby causing the two walls of the enclosure to stick to each other.

Accordingly, an aspect of the present invention includes a scalable quasi enclosed substrate holder in which the copper (Cu) foils are used for graphene growth rather than putting the Cu foils directly in the CVD chamber. In at least one embodiment of the invention, copper foils are used as the substrate because copper can be the same material as is used for the cover. Accordingly, the vapor of the cover will not interfere with the reaction. However, as should be appreciated by one skilled in the art, any inert material can be used as the substrate in accordance with at least one embodiment of the invention. By way of example, such an inert material that can be used for the substrate can include quartz.

As detailed herein, the graphene films grown on the copper foils in the quasi enclosed substrate holder (also referred to herein as a box) have much larger grain size than those grown on copper foils put directly in the CVD chamber. Accordingly, the larger grain size growth is facilitated by the ability of gases to move in and out of the quasi enclosed substrate holder (box), albeit move in and out of the substrate holder at a low efficiency.

In one embodiment of the invention, the substrate holder for a copper substrate for graphene growth is a prolate quartz box with one-side open. In at least one embodiment of the invention, other high temperature (resistant) (for example, greater than 1000 degrees Celsius) inert materials can be used as a material for the substrate holder. By way of example, such inert materials that can be used for the substrate holder can include sapphire or alumina. The size of the gap (that is, the opening on the one open side of the box) can be of any reasonable range because the gap will ultimately be covered by the cap. In a preferred embodiment of the invention, however, the gap has a width of a range from approximately 1 millimeters (mm) to 2 mm. An embodiment of the invention additionally includes a substrate holder that includes a cap made of a metal foil, as additionally detailed herein.

FIG. 1 is a diagram illustrating an overhead view of an example design, according to an embodiment of the present invention. By way of illustration, FIG. 1 depicts a three-dimensional (3D) overhead view 102 including the following components. Accordingly, FIG. 1 depicts a prolate quartz box 100 with one-side open. The gap for the open side is a width of a range from approximately 1 to 2 mm. Length and width of the box are determined (or limited) by the CVD chamber size. In other words, the box must be small enough to put into the CVD chamber, but there need not be a preferred size ratio therewith.

As also depicted in FIG. 1, cap 110, disposed over the one open side of box 100, is made of a metal foil (for example, copper). In at least one embodiment of the invention, copper foils are used as the cap/cover because copper can be the same material as is used for the substrate for graphene growth. In such an embodiment of the invention, the vapor of the cover will not interfere with the reaction. However, as should be appreciated by one skilled in the art, any inert material can be used as the cover in accordance with at least one embodiment of the invention. By way of example, such an inert material that can be used for the cover can include quartz. In an embodiment of the invention, as noted, the cap should be the same metal as the substrate used for graphene growth.

As detailed further herein, in an aspect of the invention, the cap completely covers the open side but does not form a seal. Thus, gases can still go in and come out but with low efficiency.

As further depicted in FIG. 1, copper substrate 120, located inside the open-sided box 100, is for graphene growth.

Figure 2:
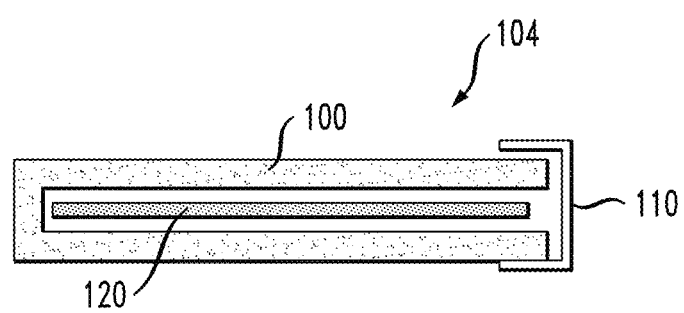
FIG. 2 is a diagram illustrating a cross-section view of an example design, according to an embodiment of the present invention.

FIG. 2 is a diagram illustrating a cross-section view of an example quasi enclosed substrate holder design, according to an embodiment of the present invention. By way of illustration, FIG. 2 depicts a cross-section view 104 including the same components as depicted in the overhead view of FIG. 1. Accordingly, FIG. 2 depicts a prolate quartz box 100 with one-side open, a cap 110, disposed over the one open side of box 100, and a substrate 120, located inside the open-sided box 100, for graphene growth. As noted above and again illustrated in FIG. 2, the cap 110 completely covers the open side of the box 100, but does not form a seal, allowing gases to move in and out of the box 100, albeit with low efficiency.

Figure 3:
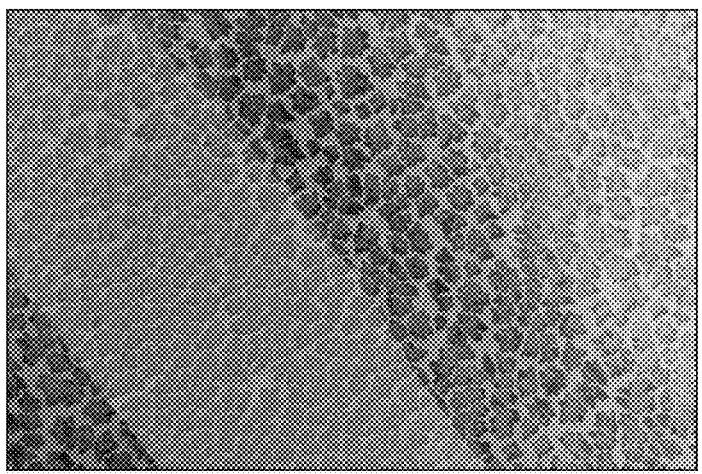
FIG. 3 is a diagram illustrating graphene grain density, according to an embodiment of the present invention.

FIG. 3 is a diagram illustrating graphene grain density, according to an embodiment of the present invention. By way of illustration, FIG. 3 depicts an illustration 202 of normal growth (that is, copper foils directly put into the CVD chamber).

Figure 4:
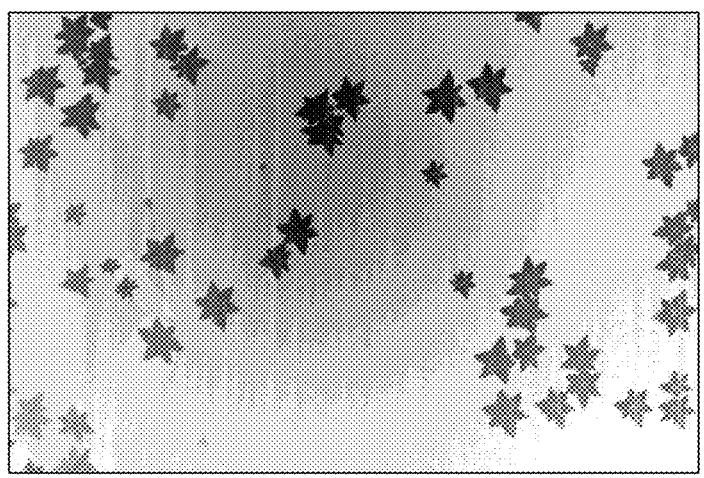
FIG. 4 is a diagram illustrating graphene grain density, according to an embodiment of the present invention.

Additionally, FIG. 4 is a diagram illustrating graphene grain density information, according to an embodiment of the present invention. By way of illustration, FIG. 4 depicts an image 204 representative of graphene grown on the inside surface of a copper enclosure.

Figure 5:
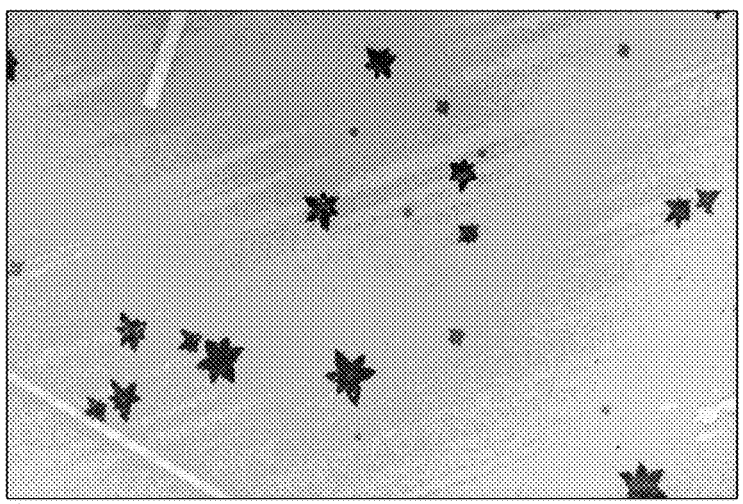
FIG. 5 is a diagram illustrating graphene grain density, according to an embodiment of the present invention.

FIG. 5 is a diagram illustrating graphene grain density, according to an embodiment of the present invention. By way of illustration, FIG. 5 depicts an illustration 206 of graphene grown on a copper substrate inside of a quasi enclosed box, as described herein.

It can be seen in FIG. 3 through FIG. 5 that graphene grain density is much smaller for the case of a copper enclosure 204 depicted in FIG. 4 and the quasi enclosed box 206 depicted in FIG. 5 than the normal growth illustration 202 depicted in FIG. 3. Accordingly, as further detailed herein, the use of the quasi enclosed box produces graphene films with much larger grain size, wherein grain size is the reciprocal of grain density.

Figure 6:
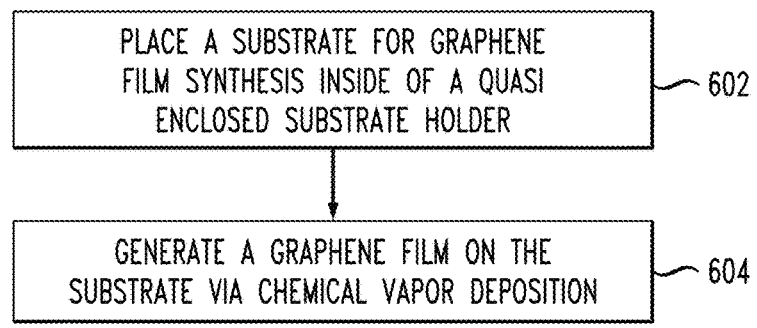
FIG. 6 is a flow diagram illustrating techniques for generating a graphene film, according to an embodiment of the present invention.

FIG. 6 is a flow diagram illustrating techniques for generating a graphene film, according to an embodiment of the present invention. Step 602 includes placing a substrate for graphene film synthesis inside of a quasi enclosed substrate holder. The quasi enclosed substrate holder includes one open side and a cap disposed over the open side of the quasi enclosed substrate holder. The quasi enclosed substrate holder is scalable and can include a high temperature (resistant) inert material. By way of example, the substrate holder can be a prolate quartz box with one open side. As used herein, that the quasi enclosed substrate holder is scalable refers to the fact that the length and width of the substrate holder can be multiple sizes while keeping the gap size unchanged. Accordingly, a quasi enclosed substrate holder such as detailed herein can be used for copper foils of any size.

The cap (or cover) placed over the open side of the quasi enclosed substrate holder can be made of an inert material. By way of example, the cap can be a metal foil (for example, copper). The quasi enclosed substrate holder includes one open side, that is, a gap having a width in the range of from about 1 mm to 2 mm. Additionally, in at least one embodiment of the invention, the quasi enclosed substrate holder has a length and a width determined by a chemical vapor deposition chamber size. For example, the quasi enclosed substrate holder, in such embodiments, can be as long and as wide so as to still permit the substrate holder to fit inside the particular chemical vapor deposition chamber.

Step 604 includes generating a graphene film on the substrate via chemical vapor deposition. By way of example, in the traditional chemical vapor deposition process, the substrate is put into the chemical vapor deposition chamber directly and exposed to a gas flow. Thus, the dynamic flow parameters (for example, gas flow rate and geometry, and dimensions of the CVD chamber) may also affect graphene growth. In an aspect of the invention, however, within the box, the gases are quasi static. Molecules move only by diffusion, thus leading to larger graphene domain size by using the quasi-enclosed box. In at least one embodiment of the invention, the cap/cover should fit as tightly as possible over the quasi enclosed substrate while still permitting gases to move in and out of the holder.

Additionally, the substrate, as described herein, can be an inert material. By way of example, the substrate can be a metal foil (for example, copper). Graphene films synthesized according to at least one embodiment of the invention have larger domain size and thus less domain boundaries. This is, in existing approaches, one of the main defects degrading graphene quality on their mechanical strength and thermal and electrical transport properties. In other words, larger domain graphene films have higher quality.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. An apparatus for graphene film synthesis, comprising:
   a horizontally-oriented substrate holder having a first width and a first height, wherein the substrate holder includes (i) an open front side, and (ii) two solid lateral sides each comprised of a solid material, (iii) a solid back side comprised of the solid material, (iv) a solid top comprised of the solid material, and (v) a solid bottom comprised of the solid material, wherein the one open side exposes a cavity formed within the two solid lateral sides, the solid back side, the solid top, and the solid bottom;
   a horizontally-oriented cap having a second width and a second height, wherein the cap comprises solid copper foil, and wherein the cap includes (i) an open back side, (ii) two solid lateral sides each comprised of the solid copper foil, (iii) a solid front side comprises of the solid copper foil, (iv) a solid top comprised of the solid copper foil, and (v) a solid bottom comprises of the solid copper foil;
   wherein the second width is greater than the first width;
   wherein the second height is greater than the first height; and
   wherein the open back side of the cap is positioned surrounding the open front side of the substrate holder, thereby forming a gap between the solid top of the cap and the solid top of the substrate holder, enabling flow of one or more gases in and/or out of the substrate holder via the open back side of the cap and the open front side of the substrate holder; and
   a substrate for graphene film synthesis located inside the cavity of the substrate holder.

2. The apparatus of claim 1, wherein the substrate holder is scalable.

3. The apparatus of claim 1, wherein the substrate holder comprises a quartz box with one open side.

4. The apparatus of claim 1, wherein the substrate holder comprises a high temperature inert material.

5. The apparatus of claim 1, wherein the open front side of the substrate holder includes a non-enclosed portion having a width in the range of from about 1 mm to 2 mm.

6. The apparatus of claim 1, wherein the substrate is an inert material.

7. The apparatus of claim 1, wherein the substrate is a metal foil.

8. The apparatus of claim 7, wherein the metal foil comprises a copper foil.

* * * * *